United States Patent
Pan et al.

(10) Patent No.: US 6,335,270 B2
(45) Date of Patent: Jan. 1, 2002

(54) SEMICONDUCTOR PROCESSING METHODS OF FORMING CONTACT OPENINGS, METHODS OF FORMING MEMORY CIRCUITRY, METHODS OF FORMING ELECTRICAL CONNECTIONS, AND METHODS OF FORMING DYNAMIC RANDOM ACCESS MEMORY (DRAM) CIRCUITRY

(75) Inventors: Pai-Hung Pan, Boise; Luan C. Tran, Meridian; Tyler A. Lowrey, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/848,863

(22) Filed: May 3, 2001

Related U.S. Application Data (62) Division of application No. 09/765,236, filed on Jan. 16, 2001, which is a division of application No. 09/387,040, filed on Aug. 31, 1999.

(51) Int. Cl.[7] .............................................. H01L 21/44
(52) U.S. Cl. ...................................... 438/597; 438/239
(58) Field of Search ................................ 438/239, 241, 438/250, 253, 256, 396, 399, 393, 571, 573, 597

(56) References Cited

U.S. PATENT DOCUMENTS

| | | | |
|---|---|---|---|
| 5,874,359 A | 2/1999 | Liaw et al. | |
| 6,025,255 A | 2/2000 | Chen et al. | |
| 6,121,085 A | 9/2000 | Liang et al. | |
| 6,127,260 A | * 10/2000 | Huang | ........................ 438/629 |

* cited by examiner

*Primary Examiner*—David Nelms
*Assistant Examiner*—David Vu
(74) *Attorney, Agent, or Firm*—Wells, St. John, Roberts, Gregory & Matkin P.S.

(57) ABSTRACT

Methods of forming contact openings, memory circuitry, and dynamic random access memory (DRAM) circuitry are described. In one implementation, an array of word lines and bit lines are formed over a substrate surface and separated by an intervening insulative layer. Conductive portions of the bit lines are outwardly exposed and a layer of material is formed over the substrate and the exposed conductive portions of the bit lines. Selected portions of the layer of material are removed along with portions of the intervening layer sufficient to (a) expose selected areas of the substrate surface and to (b) re-expose conductive portions of the bit lines. Conductive material is subsequently formed to electrically connect exposed substrate areas with associated conductive portions of individual bit lines.

16 Claims, 12 Drawing Sheets

SEMICONDUCTOR PROCESSING METHODS OF FORMING CONTACT OPENINGS, METHODS OF FORMING MEMORY CIRCUITRY, METHODS OF FORMING ELECTRICAL CONNECTIONS, AND METHODS OF FORMING DYNAMIC RANDOM ACCESS MEMORY (DRAM) CIRCUITRY

CROSS REFERENCE TO RELATED APPLICATION

This patent application is a Divisional Application of U.S. patent application Ser. No. 09/765,236, filed on Jan. 16, 2001, entitled "Semiconductor Processing Methods Of Forming Contact Openings, Methods Of Forming Memory Circuitry, Methods Of Forming Electrical Connections, and Methods Of Forming Dynamic Random Access Memory (DRAM) Circuitry", naming Pai-Hung Pan, Luan C. Tran and Tyler A. Lowery as inventors, which is a Divisional of U.S. patent application Ser. No. 09/387,040, filed on Aug. 31, 1999.

TECHNICAL FIELD

This invention relates to semiconductor processing methods of forming contact openings, methods of forming memory circuitry, methods of forming electrical connections, and methods of forming dynamic random access memory (DRAM) circuitry.

BACKGROUND OF THE INVENTION

Semiconductor processing typically involves a number of processing steps including material deposition, masking with masking layers, and etching to define integrated circuitry structures. At each processing step there are risks that the integrated circuitry being formed can be compromised. As the complexity of integrated circuitry increases, so too can the processing complexities and the risk that the formed circuitry will be compromised. One of the factors that contributes to the risk of compromised integrated circuitry is the number of masking steps that are used in a particular processing flow. The more masking steps, the more the likelihood is that a misalignment can occur. Another problem which has implications insofar as device integrity is concerned relates to conductive material undesirably remaining behind over wafer areas. Such remnant material is sometimes referred to as "stringers" and can cause device components to short to one another. Accordingly, there is a need within the industry to reduce the likelihood that these and other problems will affect the integrated circuitry being formed.

This invention arose out of concerns associated with improving the methods by which integrated circuitry is formed and reducing the risks that the formed circuitry will be compromised.

SUMMARY OF THE INVENTION

Methods of forming contact openings, memory circuitry, and dynamic random access memory (DRAM) circuitry are described. In one implementation, an array of word lines and bit lines are formed over a substrate surface and separated by an intervening insulative layer. Conductive portions of the bit lines are outwardly exposed and a layer of material is formed over the substrate and the exposed conductive portions of the bit lines. Selected portions of the layer of material are removed along with portions of the intervening layer sufficient to (a) expose selected areas of the substrate surface and to (b) re-expose conductive portions of the bit lines. Conductive material is subsequently formed to electrically connect exposed substrate areas with associated conductive portions of individual bit lines.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
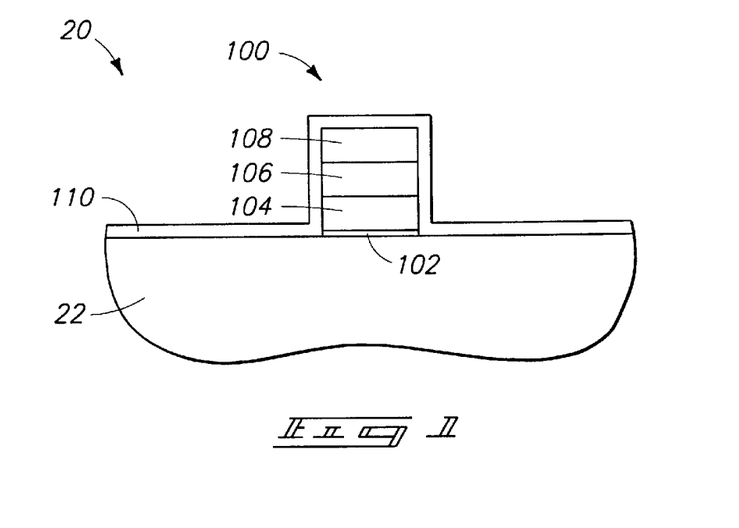
FIG. 1 is a diagrammatic sectional view of a wafer fragment in process, and an exemplary conductive line formed thereover.

Referring to FIG. 1, a semiconductor wafer fragment is indicated generally at 20 and comprises a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An exemplary conductive line or gate is shown generally at 100. The illustrated conductive line and the description of the formation of the various NMOS FETs and PMOS FETs which follow constitute but one way of forming specific conductive lines. Accordingly, other conductive lines and methods of forming the same can be utilized in the context of the invention. Various aspects of the invention are described in the context of memory circuitry, and in particular, dynamic random access memory (DRAM) circuitry. Such circuitry is typically formed over a wafer and can be categorized as including array circuitry (i.e. circuitry formed within a memory array) and peripheral circuitry (i.e. circuitry formed outside the memory array and operably coupled therewith). Conductive lines, such as line 100, can be formed to constitute both array circuitry and peripheral circuitry. An exemplary conductive line construction can comprise a conventional gate stack, e.g., a gate oxide layer 102, a polysilicon layer 104, and a tungsten silicide layer 106. A dielectric cap 108 can be provided over the conductive material and can be formed from suitable materials such as oxides, nitrides, and the like. Following a patterning and etching step in which the conductive lines are formed, a lightly doped drain (LDD) diffusion step can take place to form lightly doped drain regions (not specifically shown). Subsequently, a layer 110 comprising an oxide material formed through decomposition of tetraethylorthosilicate (TEOS) can be deposited to a thickness of around 600 Angstroms.

Figure 2:
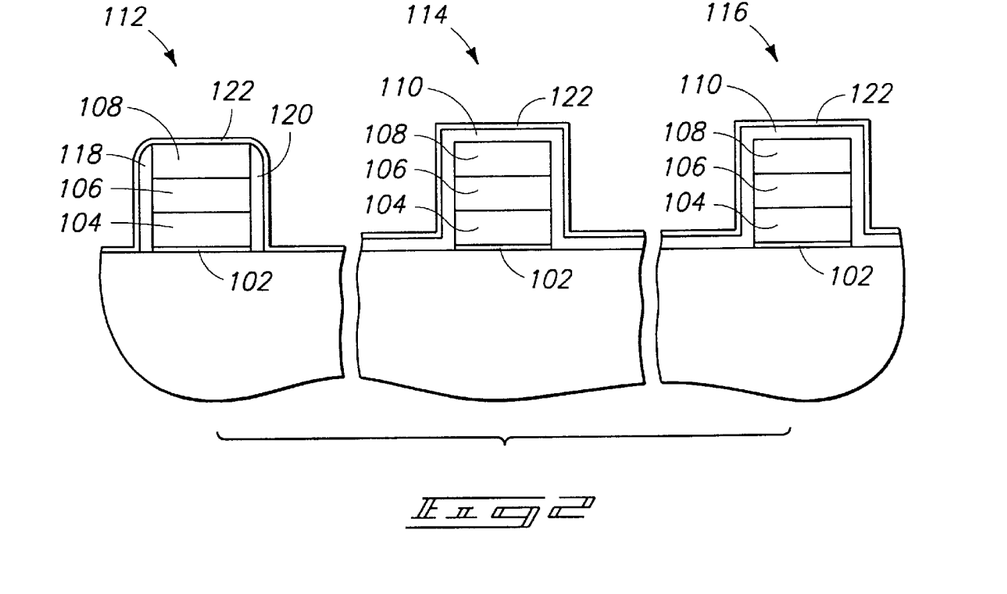
FIG. 2 is a diagrammatic sectional view of a plurality of conductive lines.

Referring to FIG. 2, three illustrative conductive lines are shown generally at 112, 114, and 116. Line 112 comprises an NMOS FET, line 114 comprises a PMOS FET, and line 116 comprises a conductive line which is formed within the memory array. An exemplary processing technique for forming NMOS FETs includes forming photoresist over the substrate and exposing conductive lines which are to constitute the gates of NMOS FETs. Accordingly lines 114 and 116 would be covered with photoresist. Layer 110 is subsequently etched to form sidewall spacers 118, 120. Source/drain implants are then formed (not shown), i.e. by implanting arsenic or boron. Subsequently, the resist is stripped, followed by formation of an oxide layer 122 from decomposition of TEOS to a thickness of around 100–200 Angstroms. Such layer can be formed over all of the lines.

Figure 3:
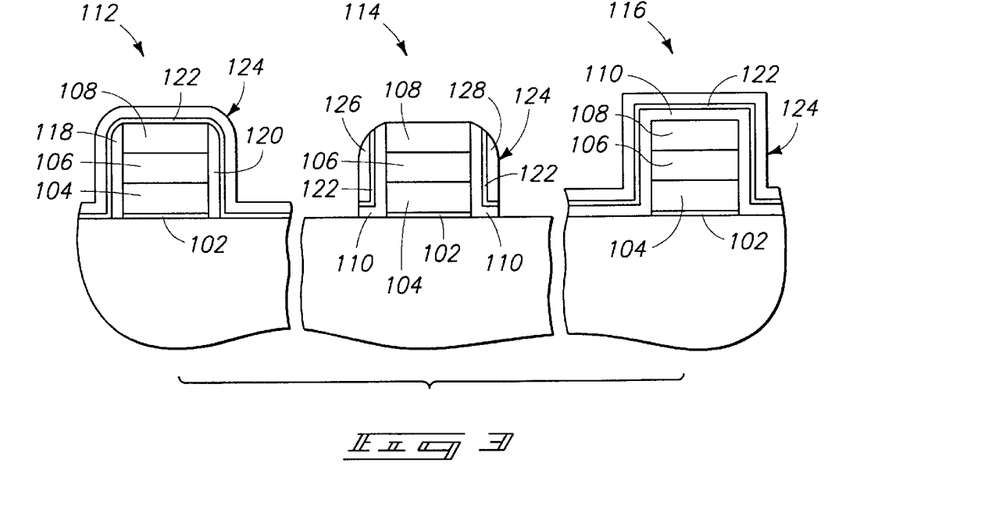
FIG. 3 is a view of the FIG. 2 conductive lines at a different processing step.

Referring to FIG. 3, PMOS FETs can be formed by depositing a layer 124 of polysilicon (or nitride) to a thickness of around 500 Angstroms, forming photoresist (not shown) over conductive lines 112 and 116, and etching layers 124, 122, and 110 over line 114 to form sidewall spacers 126, 128. Source/drain regions can be formed through implantation of $BF_2$ followed by an angled implantation of phosphorous. Subsequently, the photoresist can be stripped.

Figure 4:
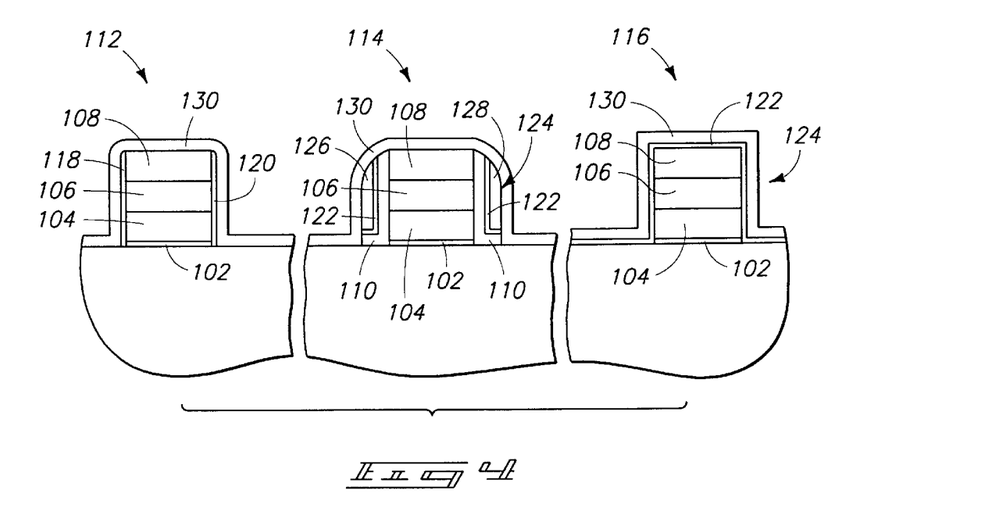
FIG. 4 is a view of the FIG. 3 conductive lines at a different processing step.

Referring to FIG. 4, material of layers 124 and 122 can be subsequently removed from over lines 112, 116, followed by deposition of a layer 130 comprising oxide formed through decomposition of TEOS, to a thickness of about 300 Angstroms. The above description constitutes but one method for forming spacers associated with the conductive lines.

Figure 5:
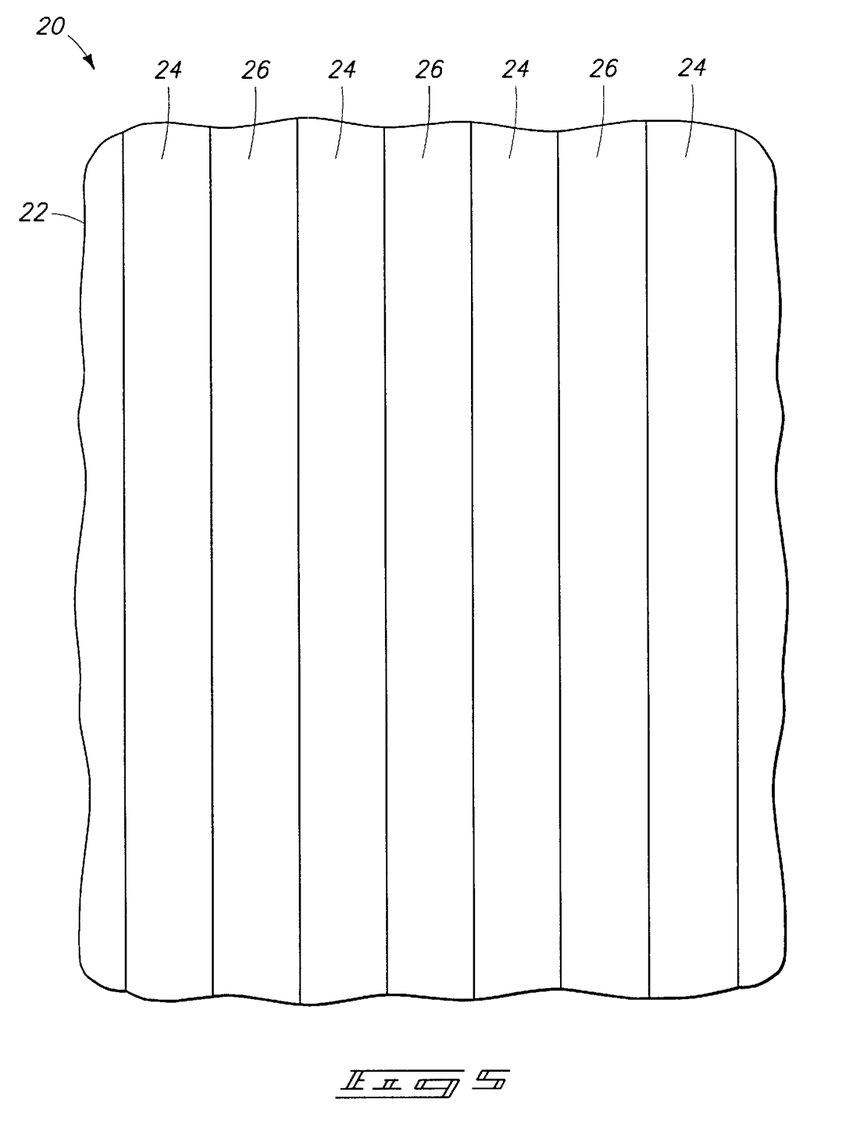
FIG. 5 is a top plan view of a semiconductor wafer fragment.

The discussion now proceeds with reference to FIG. 5 wherein substrate 22 is shown prior to formation of the above described conductive lines. A plurality of isolation regions 24 are provided and between which are defined a plurality of active areas 26. Isolation regions 24 can be formed through known shallow trench isolation (STI) or other techniques.

Figure 6:
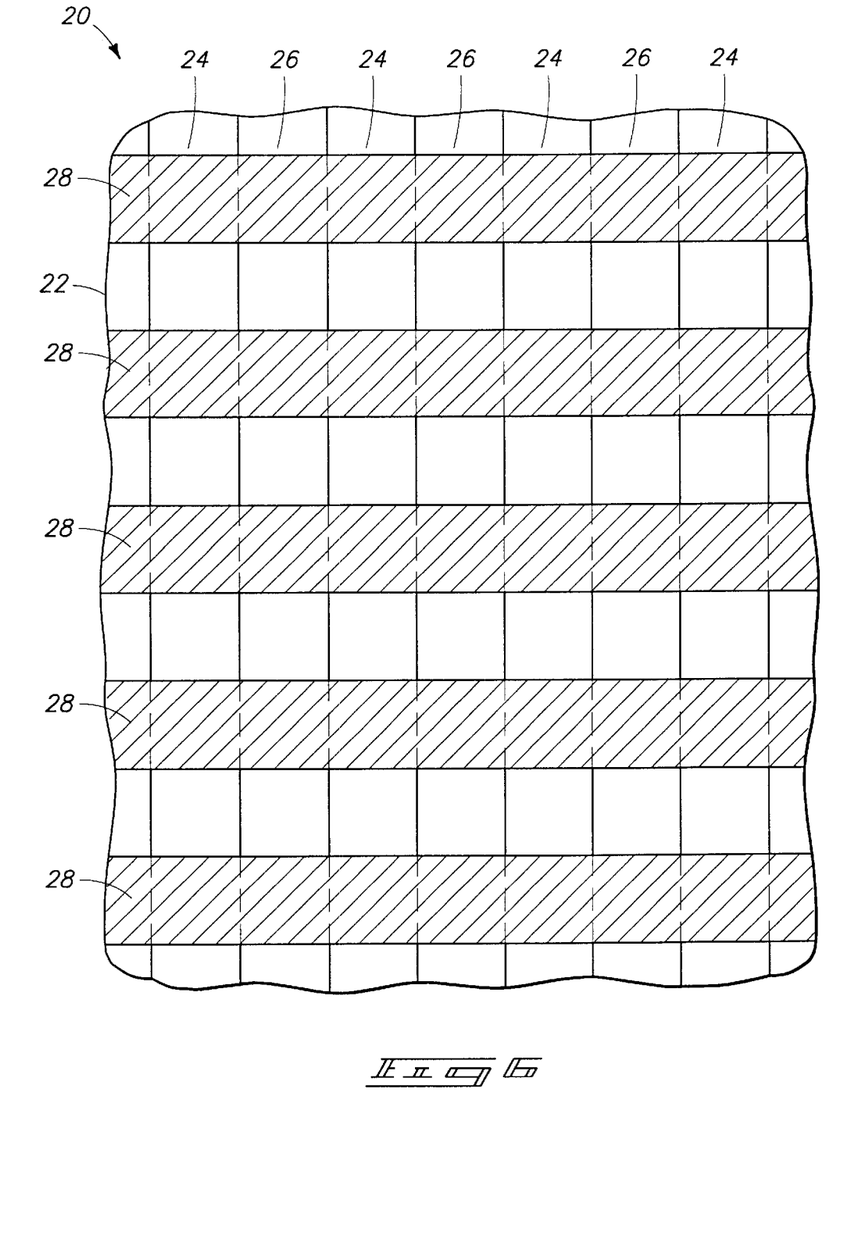
FIG. 6 is a view of the FIG. 5 wafer fragment at a different processing step.

Referring to FIG. 6, a plurality of conductive lines 28 are formed over substrate 22 and preferably comprise a series of word lines for a memory array, such as a dynamic random access memory (DRAM) array. The illustrated conductive lines 28 can correspond to conductive line 116 described above, in connection with FIGS. 1–4.

Figure 7:
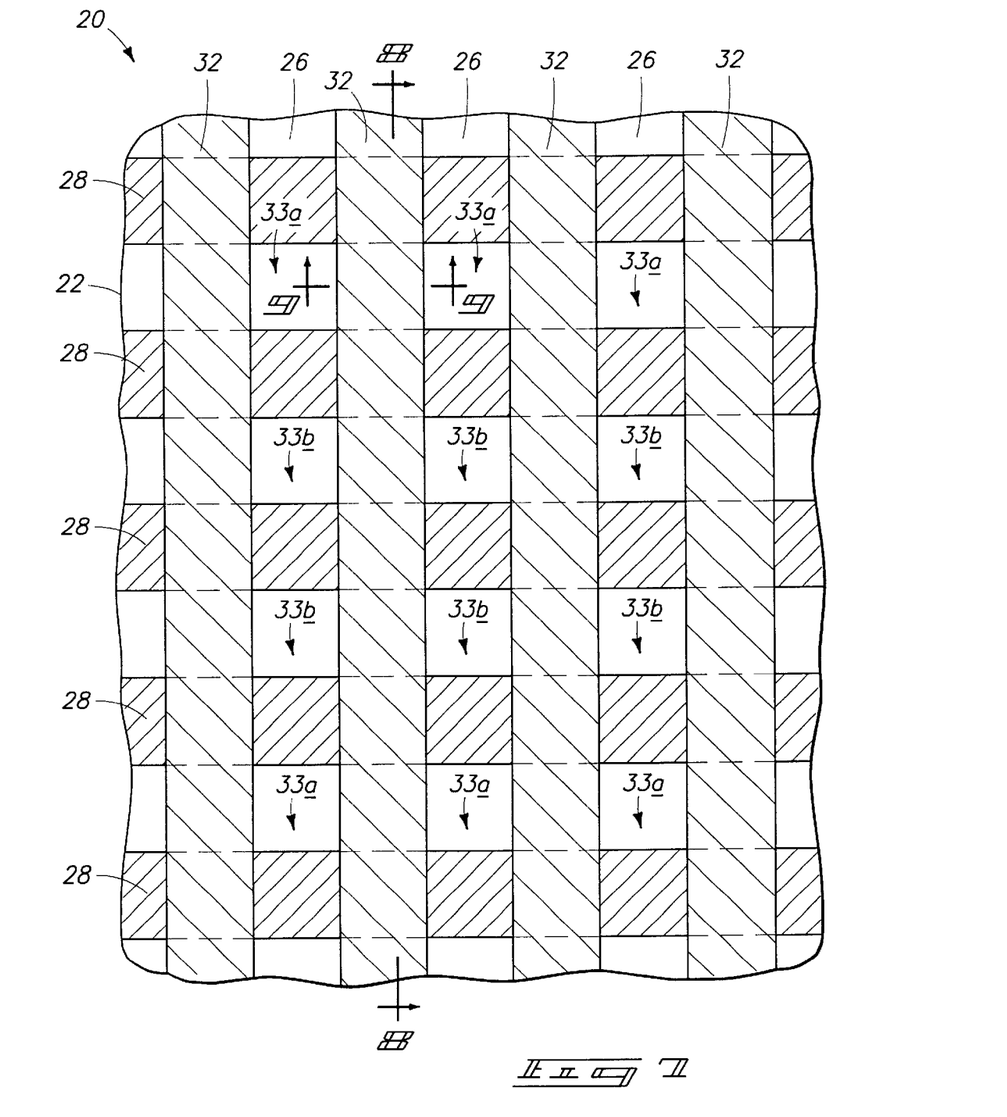
FIG. 7 is a view of the FIG. 6 wafer fragment at a different processing step.
Figure 8:
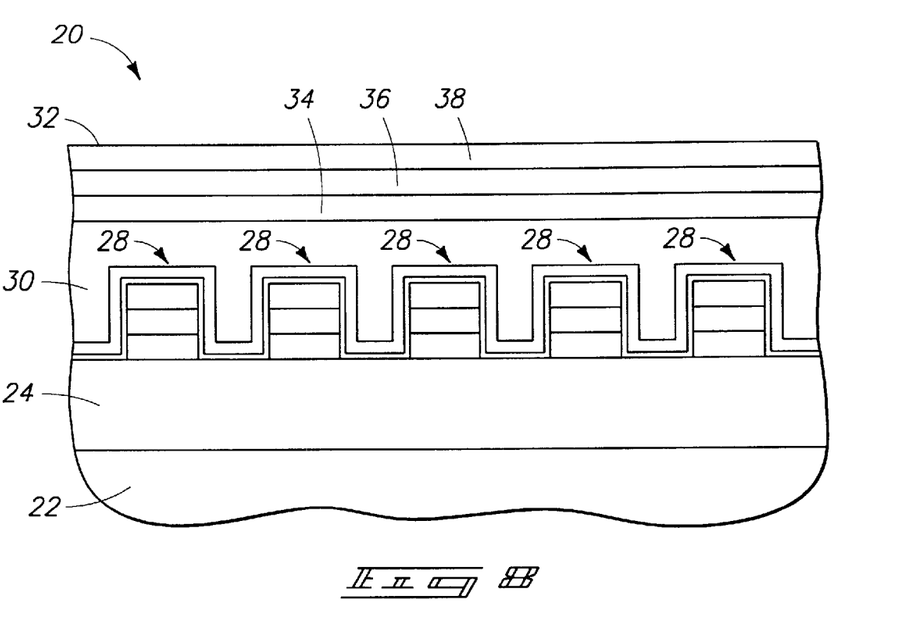
FIG. 8 is a diagrammatic sectional view of the FIG. 7 wafer fragment taken along line 8—8 in FIG. 7.

Referring to FIGS. 7 and 8, a first insulative oxide layer 30 (FIG. 8) is formed over substrate 22 and word lines 28. An exemplary and preferred material for layer 30 comprises borophosphosilicate glass which can be deposited to a thickness of between about 10,000 to 14,000 Angstroms. Layer 30 can be subsequently reflowed and chemical mechanical polished to planarize the layer. The planarization of layer 30 preferably terminates over conductive lines 28.

A plurality of bit lines 32 are formed over planarized first insulative layer 30. Exemplary bit lines 32 can comprise a layer of polysilicon or a conductive barrier layer 34, a silicide or refractive metal (e.g., W) layer 36, and a dielectric cap 38 formed from suitable dielectric materials (including $WN_x$, $TiN_x$, etc.) such as oxides, nitrides, and/or both. Such layers are subsequently patterned into the individual bit lines shown in FIG. 7. Sidewall spacers are preferably provided over the bit lines and can comprise an oxide formed through decomposition of TEOS, or a suitable nitride deposited through low-pressure chemical vapor deposition.

Collectively, bit lines 32 and word lines 28 comprise a matrix (FIG. 7) which is formed over the substrate. In a preferred embodiment, the matrix defines a memory array comprising a dynamic random access memory (DRAM) array. Insulative oxide layer 30 (FIG. 8) defines an intervening layer which separates the word lines and bit lines. For purposes of the ongoing discussion, word lines 28 define a first series of conductive lines, and bit lines 32 define a second series of conductive lines which are disposed over the first series of conductive lines. Within the array are defined a plurality of substrate contact areas, i.e. source/drain diffusion regions, with which electrical communication is desired. In a preferred embodiment, substrate contact areas 33*a* (FIG. 7) comprise bit line contact areas and substrate areas 33*b* comprise capacitor contact areas.

Figure 9:
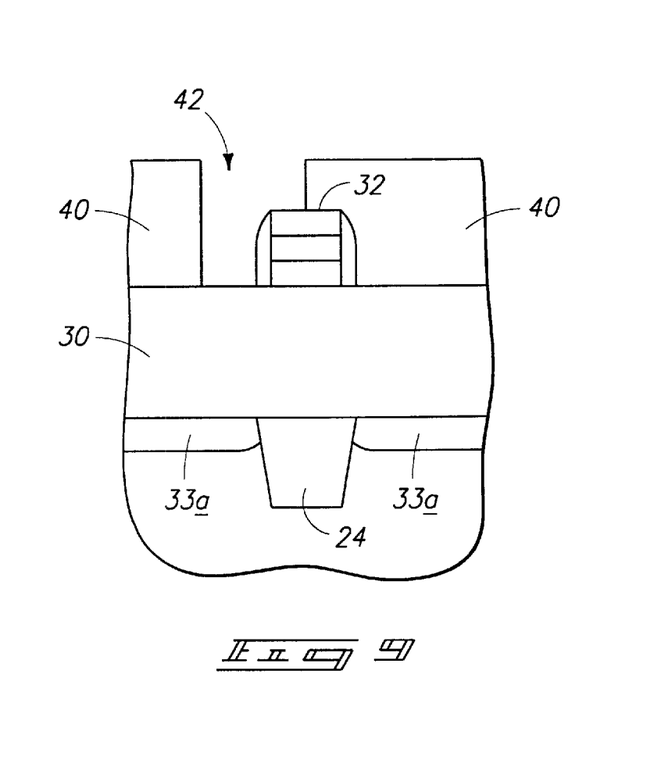
FIG. 9 is a diagrammatic side sectional view taken along line 9—9 in FIG.
Figure 10:
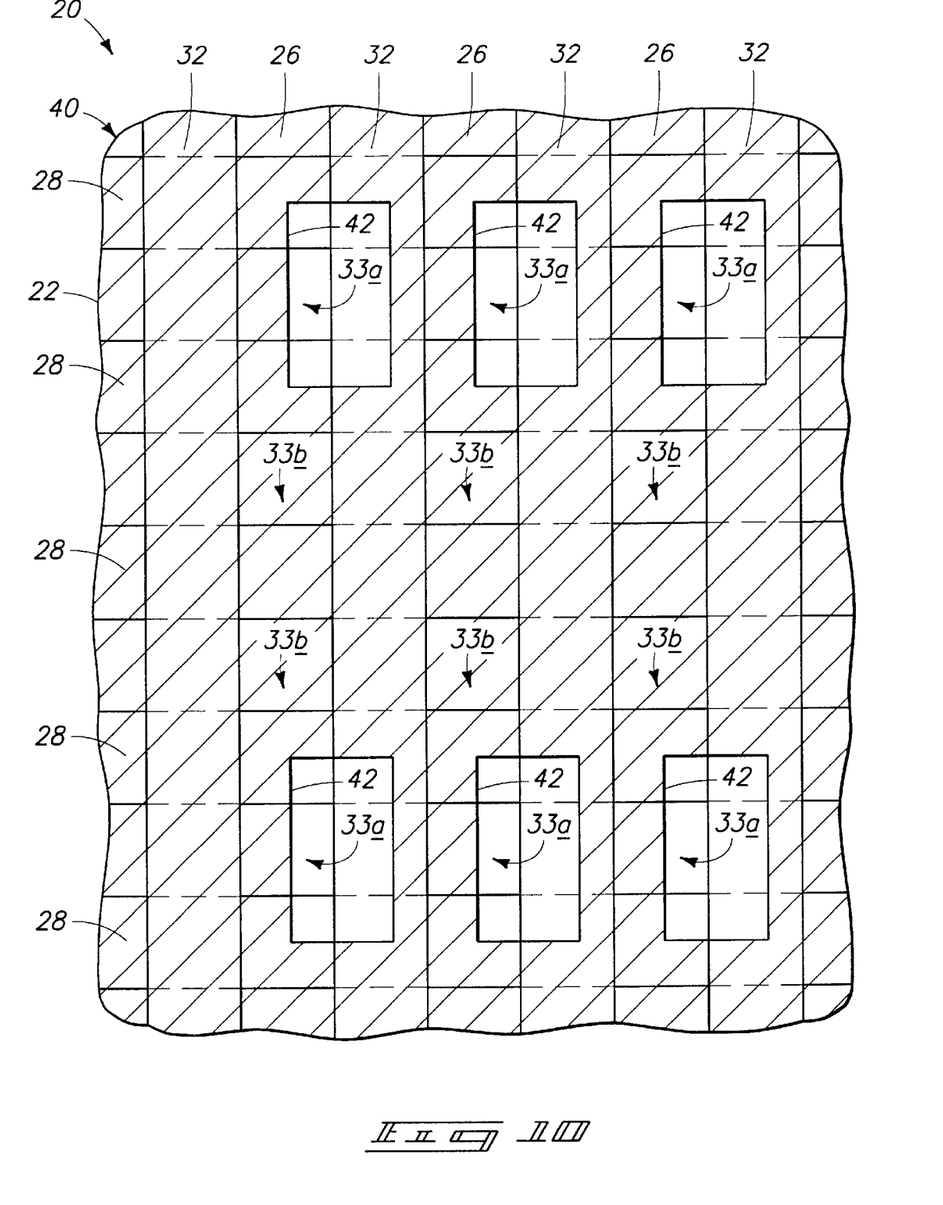
FIG. 10 is a view of the FIG. 7 wafer fragment at a different processing step.

Referring to FIGS. 9 and 10, a masking layer 40 is formed over substrate 22 and patterned to define a plurality of openings 42 over, and expose portions of bit lines 32, which in this example, constitute the uppermost conductive lines of the first and second series of conductive lines. The openings also define an area over the bit line contact areas 33*a*.

Figure 11:
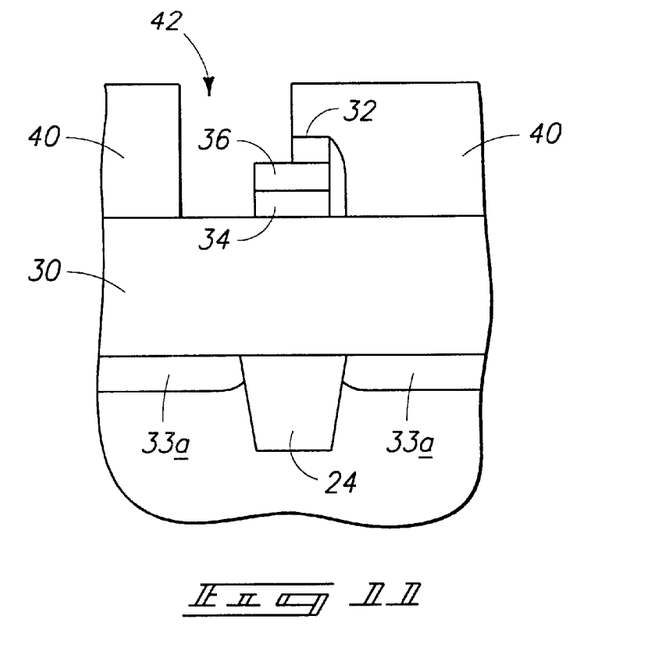
FIG. 11 is a view of the FIG. 9 wafer fragment at a different processing step.

Referring to FIG. 11, unmasked insulative material of the individual bit lines is removed to expose underlying conductive material 36, 34. The insulative material is preferably etched, selectively, relative to intervening insulative oxide layer 30. Such constitutes exemplary partially forming of a first contact opening which exposes conductive material of the individual bit lines over insulative layer 30. The removing of the bit line material can remove some of material 30. In one aspect, an angled etch can be conducted to expose only sidewall portions of the individual bit lines. In a preferred aspect, an anti-reflective coating layer (not shown) can be deposited and over which the illustrated masking layer 40 is formed. A reactive ion etch (RIE) can be conducted which is highly. selective to the underlying insulative oxide layer 30. Such etch exposes the illustrated top portion of bit lines 32, as well as sidewall portions thereof which includes conductive material of both layers 34, 36.

After the exposing of the conductive portions of the bit lines, the photoresist is stripped away.

Figure 12:
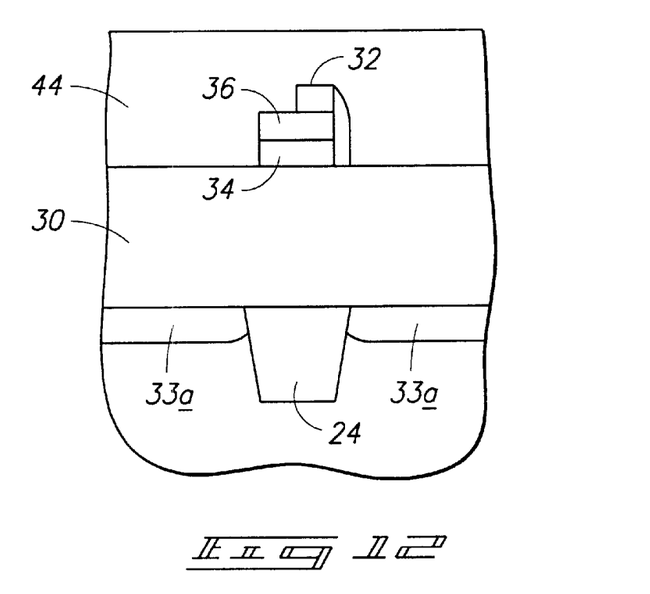
FIG. 12 is a view of the FIG. 11 wafer fragment at a different processing step.

Referring to FIG. 12, a layer of material 44 is formed over substrate 22 and the exposed conductive portions of the individual bit lines. Such material at least partially fills the contact opening formed through the removal of the insulative portions of the bit lines mentioned above. Preferably, layer 44 is a second insulative oxide layer comprising borophosphosilicate glass. Layer 44 can be formed to a thickness of 8,000 to 10,000 Angstroms, and thereafter reflowed and planarized, as by chemical mechanical polishing which terminates on or over individual bit lines 32.

Figure 13:
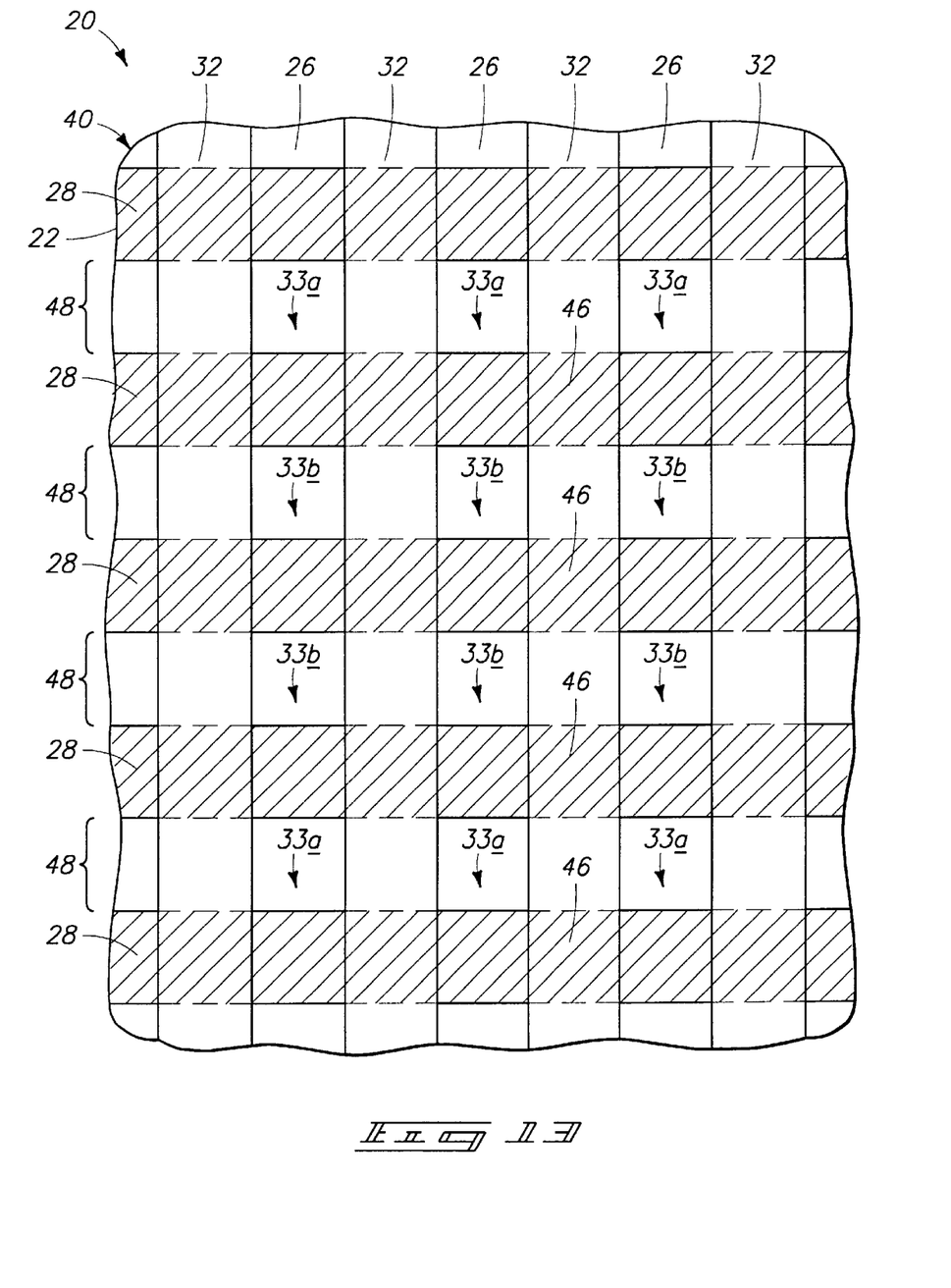
FIG. 13 is a view of the FIG. 10 wafer fragment at a different processing step.

Referring to FIG. 13, a patterned masking layer 46 is formed over substrate 22 and defines a plurality of openings 48 over the substrate node locations with which electrical communication is desired. In the illustrated example, such substrate node locations include both the bit line contact areas 33a and the capacitor contact areas 33b.

Figure 14:
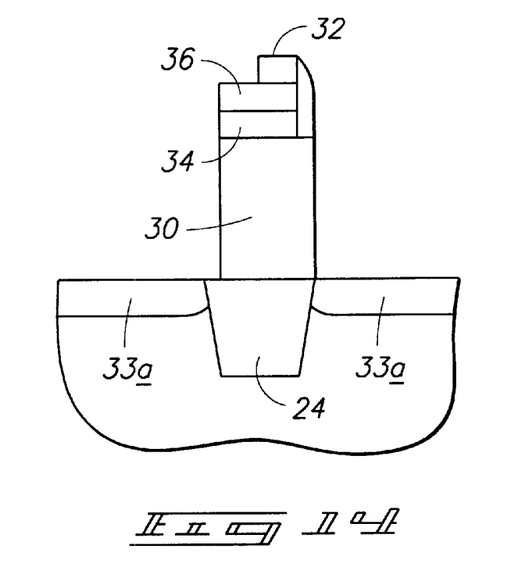
FIG. 14 is a view of the FIG. 12 wafer fragment at a different processing step.
Figure 15:
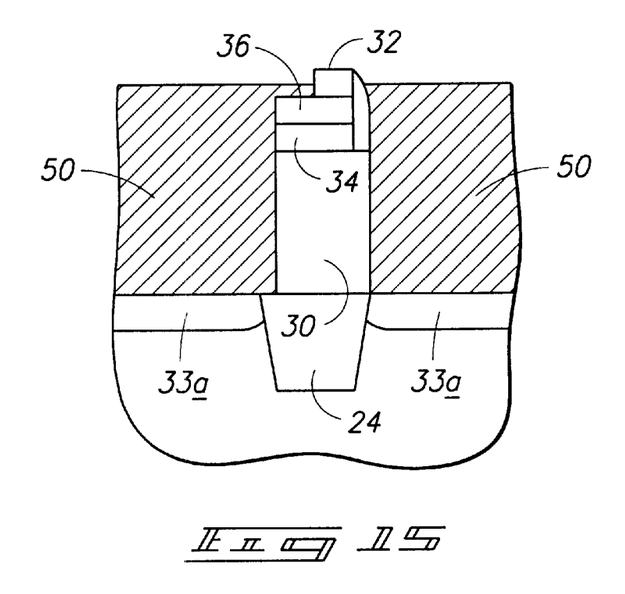
FIG. 15 is a view of the FIG. 14 wafer fragment at a different processing step.

Referring to FIGS. 14 and 15, material from over substrate 22 is removed through masked openings 48 sufficiently to form second contact openings which expose both the conductive material of the individual bit lines which was previously exposed, and the individual substrate node locations with which electrical communication with the bit lines is desired. The removal of such material also exposes node locations 33b (FIG. 13) over which capacitors are to be formed. The first and second insulative oxide layers 30 and 44 can be selectively etched relative to material from which the bit lines and word lines are formed. Such etch forms contact openings which are self-aligned relative to both the word lines and the bit lines and defines bit line contact openings and capacitor contact openings. Exemplary etch chemistries can include gases such as $CF_4$, $CHF_3$, $CH_2F_2$, Ar, and $O_2$. Reactor power can be provided at around 700 Watts, with pressures around 30 mTorr. Other exemplary processing can take place as described in U.S. Pat. No. 5,286,344, which is incorporated by reference herein.

Referring to FIG. 15, conductive material 50 is formed over the substrate and within the bit line contact openings and the capacitor contact openings. Accordingly, material 50 establishes electrical communication or electrically connects individual bit line contact areas 33a with their associated individual bit lines. Such conductive material also provides material over the capacitor contact areas which will ultimately form conductive plugs therewithin. An exemplary and preferred material is polysilicon which can be deposited and subsequently isolated within the individual openings as by reactive ion etch or other suitable isolation techniques. Such constitutes forming a plurality of conductive interconnects which establish electrical communication between the bit lines and the substrate node locations.

Figure 16:
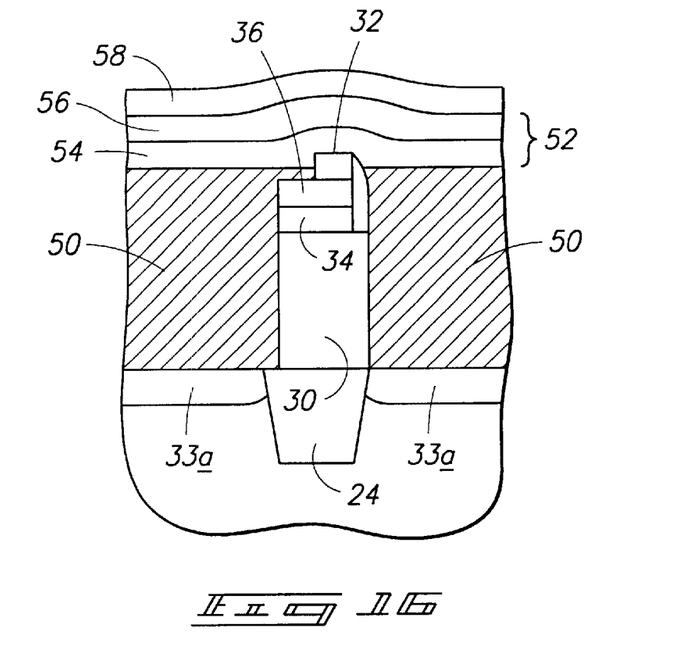
FIG. 16 is a view of the FIG. 15 wafer fragment at a different processing step.

Referring to FIG. 16, insulative material 52 is formed over substrate 22 and conductive material 50. In the illustrated example, insulative material 52 comprises a first layer 54 and a second layer 56. Materials can be selected for layers 54, 56 which are selectively etchable relative to one another. As an example, layer 54 can comprise an oxide formed through decomposition of TEOS deposited to a thickness of 400 Angstroms, and layer 56 can comprise a nitride layer formed to a thickness of 500 Angstroms. Alternatively, layer 54 can comprise a nitride layer formed to a thickness of 400 Angstroms, and layer 56 can comprise an oxide layer formed through decomposition of TEOS to a thickness of 800 Angstroms.

Figure 17:
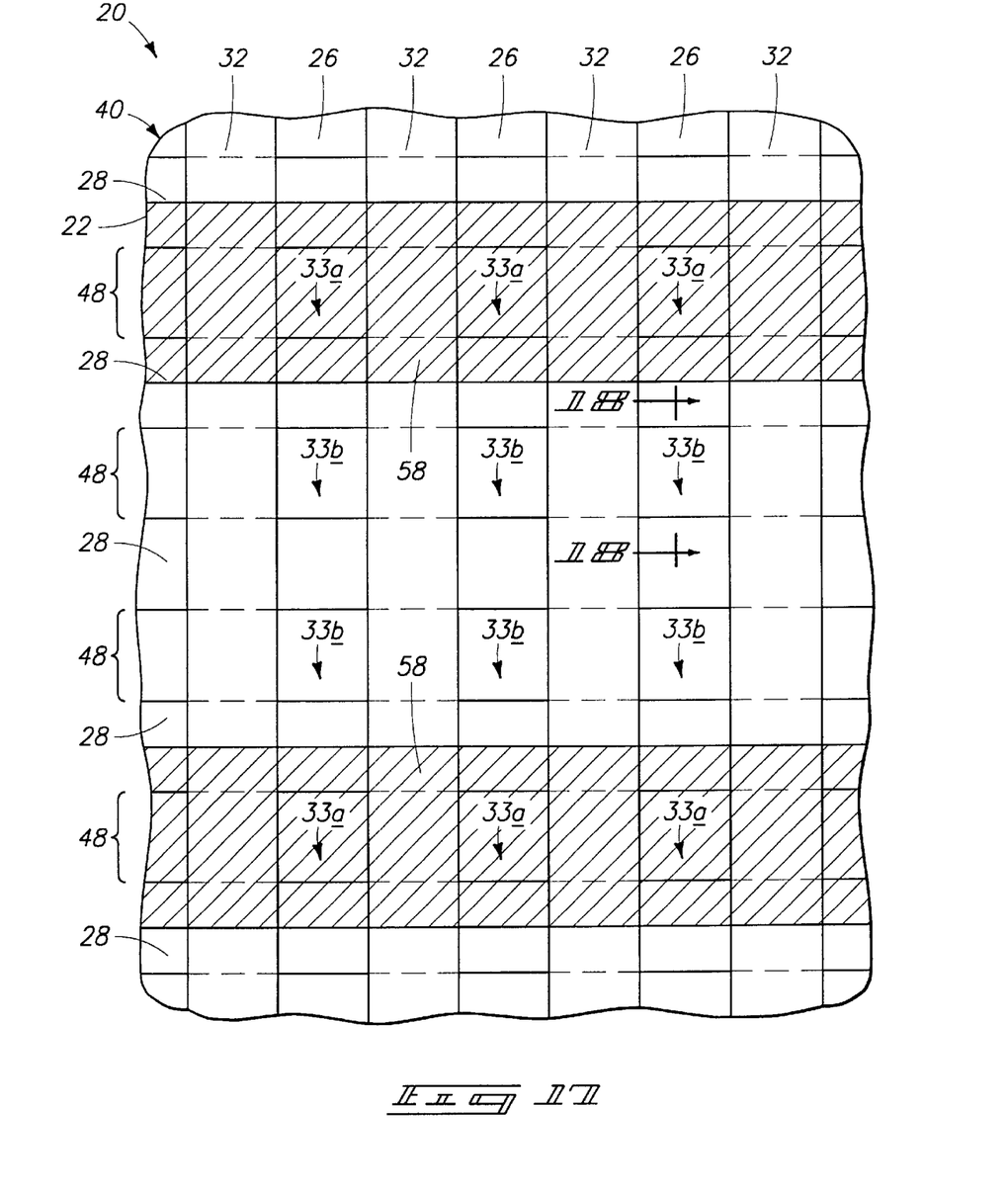
FIG. 17 is a view of the FIG. 13 wafer fragment at a different processing step.

Referring to FIGS. 16 and 17, a patterned masking layer 58 is formed over the substrate and preferably the conductive material which is formed over the individual bit line contact areas 33a.

Figure 18:
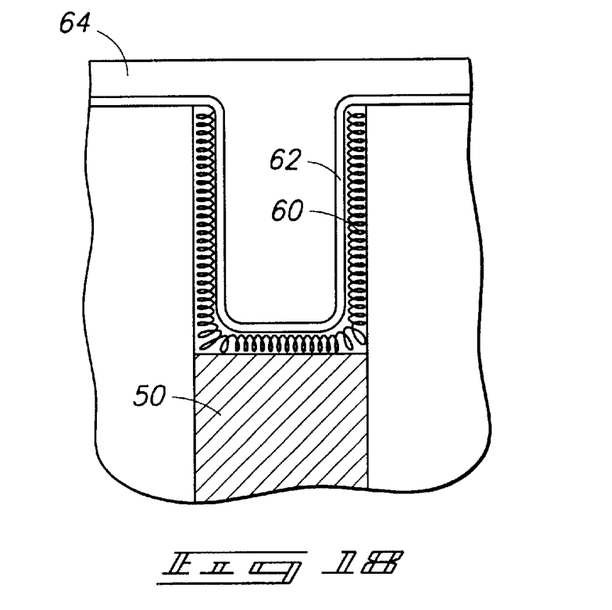
FIG. 18 is a view which is taken along line 18—18 in FIG. 17 and illustrates a portion of conductive material which supports a capacitor structure.

Referring to FIGS. 17 and 18, insulative material 52 is removed from over capacitor contact areas 33b. Capacitors are formed over and in electrical communication with conductive material 50 which is formed within the capacitor contact openings and in electrical communication with node locations 33b (FIG. 17). For illustrative purposes only, the capacitors include a storage node layer 60, a dielectric layer 62, and a cell plate layer 64. Various known techniques and materials can be utilized in forming the capacitors. In some embodiments, the storage node layer 60 is formed from polysilicon presenting a roughened surface, such as hemispherical grain polysilicon, as represented by the shading in FIG. 18, in order to provide increased capacitance.

The above described method has advantages in that polysilicon stringers (which can cause shorting) are reduced, if not eliminated. Additionally, less masks are needed which reduces processing complexity. The method also provides for self-aligned contact openings to be etched at the same time, with the openings being self-aligned to both the word lines and the bit lines.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming DRAM circuitry comprising:

forming an array of word lines and bit lines over a substrate, the bit lines being formed over the word lines and atop a first generally planarized insulative layer portions of which are disposed between the word lines and bit lines;

forming a masking layer over the substrate having openings therein which expose portions of the bit lines;

selectively etching bit line material through the openings relative to the insulative layer sufficient to expose conductive portions of the bit lines;

forming a second insulative layer over the substrate and the exposed conductive portions of the bit lines;

etching a plurality of contact openings through the first and second insulative layers sufficient to expose underlying substrate areas and to re-expose the conductive portions of the bit lines within some of the contact openings, the contact openings defining bit line contact openings and capacitor contact openings; and depositing conductive material within the contact openings and in electrical communication with the exposed substrate areas, some of said material establishing electrical communication between the re-exposed conductive portions of the bit lines and respective associated exposed substrate areas.

2. The semiconductor processing method of claim 1, wherein etching of the bit line material comprises etching material from both the top and sides of individual bit lines sufficient to expose the conductive material.

3. The semiconductor processing method of claim 1, wherein etching of the bit line material comprises conducting an angled etch sufficient to expose conductive portions of the bit lines along individual sidewalls thereof.

4. The semiconductor processing method of claim 1, further comprising:
  forming insulative material over conductive material within the bit line contact openings; and
  forming capacitors over and in electrical communication with conductive material within the capacitor contact openings.

5. A semiconductor processing method of forming a DRAM array comprising:
  forming a plurality of conductive lines over a substrate, at least some of which comprise word lines;
  forming a first insulative layer over the substrate and word lines;
  forming a plurality of bit lines over the first insulative layer, the word lines and bit lines defining an array having substrate contact areas with which electrical communication is desired, the substrate contact areas comprising both bit line contact areas and capacitor contact areas;
  exposing conductive portions of the bit lines;
  forming a second insulative layer over the substrate and exposed conductive portions of the bit lines;
  exposing bit line contact areas, capacitor contact areas, and previously-exposed bit line conductive portions through at least one of the first and second insulative layers;
  forming conductive material over and in respective electrical communication with exposed bit line contact areas and capacitor contact areas, conductive material over the bit line contact areas establishing electrical communication with the previously-exposed bit line conductive portions;
  masking over the conductive material formed over the bit line contact areas; and
  forming a plurality of storage capacitors over the substrate, individual capacitors being in electrical communication with individual respective capacitor contact areas through the respective conductive material formed thereover.

6. The semiconductor processing method of claim 5, wherein the exposing of the conductive portions of the bit lines comprises selectively etching material of the bit lines relative to the first insulative material.

7. The semiconductor processing method of claim 5, wherein the exposing of the conductive portions of the bit lines comprises not exposing any word line material.

8. The semiconductor processing method of claim 5, wherein the exposing of the conductive portions of the bit lines comprises conducting an angled etch sufficient to expose sidewall material of the bit lines.

9. The semiconductor processing method of claim 5, wherein the exposing of the conductive portions of the bit lines comprises etching bit line material from the top and sides of the individual bit lines.

10. The semiconductor processing method of claim 5, wherein the exposing of the conductive portions of the bit lines comprises selectively etching bit line material from the top and sides of the individual bit lines relative to the first insulative material.

11. The semiconductor processing method of claim 5 further comprising planarizing the second insulative layer prior to exposing the bit line contact areas, capacitor contact areas, and bit line conductive portions.

12. The semiconductor processing method of claim 5, wherein the exposing of the bit line contact areas, capacitor contact areas, and bit line conductive portions comprises etching both the first and second insulative layers selectively relative to both bit line and word line material.

13. A semiconductor processing method of forming DRAM circuitry comprising:
  forming a matrix of conductive lines formed over a substrate, the matrix comprising an uppermost series of lines being formed over a lower series of lines, the matrix including at least two substrate node locations:
  forming a masking layer over the substrate defining a plurality of openings over an uppermost of the series of lines;
  removing material of individual lines of the uppermost series of lines and exposing conductive material of the individual lines;
  after the removing of the material of the individual lines, forming insulative material over the substrate and the exposed conductive material;
  masking over the substrate and defining mask openings over substrate node locations with which electrical communication is desired;
  removing insulative material through the mask openings and other substrate material sufficient to expose both the conductive material of the individual lines which was previously exposed and the substrate node locations with which electrical communication is desired; and
  forming a plurality of conductive interconnects over the substrate, the interconnects establishing electrical communication between second exposed conductive material of the individual lines and individual respective substrate node locations.

14. The method of forming DRAM circuitry of claim 13, wherein:
  the removing of the insulative material and the other substrate material exposes other substrate node locations with which electrical communication is desired, the other substrate node locations being different from those substrate node locations which are in electrical communication with the second exposed conductive material through individual interconnects; and
  the forming of a plurality of conductive interconnects also comprises forming conductive material over the other substrate node locations.

15. The method of forming DRAM circuitry of claim 14 further comprising:
  forming insulative material over the individual interconnects; and
  after the forming of the insulative material, forming a plurality of capacitors over the substrate and in electrical communication with the conductive material formed over the other substrate node locations.

16. The method of forming DRAM circuitry of claim 13, wherein the matrix comprises a portion of a memory array and the first and second series of conductive lines respectively comprise word lines and bit lines of the memory array.

* * * * *

UNITED STATES PATENT AND TRADEMARK OFFICE
CERTIFICATE OF CORRECTION

PATENT NO.     : 6,335,270 B2                                              Page 1 of 1
DATED          : January 1, 2002
INVENTOR(S)    : Pai-Hung Pan et al.

It is certified that error appears in the above-identified patent and that said Letters Patent is hereby corrected as shown below:

Column 2,
Line 30, replace "line 9-9 in FIG." with -- line 9-9 in FIG. 7. --

Signed and Sealed this

Eighteenth Day of June, 2002

Attest:

Attesting Officer

JAMES E. ROGAN
Director of the United States Patent and Trademark Office